(12) United States Patent
Ogiso et al.

(10) Patent No.: US 9,893,036 B2
(45) Date of Patent: Feb. 13, 2018

(54) SEMICONDUCTOR DEVICE AND MANUFACTURING METHOD OF SEMICONDUCTOR DEVICE

(71) Applicant: Toshiba Memory Corporation, Tokyo (JP)

(72) Inventors: Koji Ogiso, Oita Oita (JP); Kazuhiro Murakami, Oita Oita (JP); Tatsuo Migita, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/060,505

(22) Filed: Mar. 3, 2016

(65) Prior Publication Data

US 2016/0351540 A1    Dec. 1, 2016

(30) Foreign Application Priority Data

May 29, 2015 (JP) .................................. 2015-110601

(51) Int. Cl.
    *H01L 25/065*    (2006.01)
    *H01L 23/00*     (2006.01)
    (Continued)

(52) U.S. Cl.
    CPC ........ *H01L 25/0657* (2013.01); *H01L 23/481* (2013.01); *H01L 23/5226* (2013.01);
    (Continued)

(58) Field of Classification Search
    CPC .......................... H01L 25/0657; H01L 23/481
    See application file for complete search history.

(56) References Cited

U.S. PATENT DOCUMENTS 8,314,491 B2 * 11/2012 Yamashita .............. H01L 24/11
                                                      257/737
2008/0023836 A1 * 1/2008 Watanabe ............... H01L 24/11
                                                      257/758
(Continued)

FOREIGN PATENT DOCUMENTS

CN        101989557 A    3/2011
JP        2011049530 A   3/2011
(Continued)

OTHER PUBLICATIONS

Taiwan Office Action dated Dec. 29, 2016, filed in Taiwan counterpart Application No. 10413995, 6 pages (with translation).

*Primary Examiner* — Amar Movva
(74) *Attorney, Agent, or Firm* — Patterson & Sheridan, LLP (57) ABSTRACT

A semiconductor device includes a first substrate, an aluminum pad, a first nickel electrode, a second substrate, a second nickel electrode, and a connection layer. The first substrate includes a wiring therein. The aluminum pad is provided adjacent to a surface layer of the first substrate and is connected to the wiring. A portion of the first nickel electrode extends inwardly of the first substrate and is connected to the aluminum pad. A top surface of the first nickel electrode projects from a surface of the first substrate. A portion of the second nickel electrode extends inwardly of the second substrate. A top surface of the second nickel electrode projects from a surface of the second substrate facing the first substrate. The connection layer comprises an alloy including tin and connects the first nickel electrode and the second nickel electrode.

18 Claims, 7 Drawing Sheets

(51) Int. Cl.
  *H01L 23/48* (2006.01)
  *H01L 25/00* (2006.01)
  *H01L 23/522* (2006.01)
  *H01L 23/532* (2006.01)

(52) U.S. Cl.
  CPC .............. *H01L 24/11* (2013.01); *H01L 24/13* (2013.01); *H01L 24/14* (2013.01); *H01L 24/16* (2013.01); *H01L 25/50* (2013.01); *H01L 23/53238* (2013.01); *H01L 24/03* (2013.01); *H01L 24/05* (2013.01); *H01L 24/81* (2013.01); *H01L 2224/03614* (2013.01); *H01L 2224/03912* (2013.01); *H01L 2224/0401* (2013.01); *H01L 2224/0557* (2013.01); *H01L 2224/05073* (2013.01); *H01L 2224/05085* (2013.01); *H01L 2224/05166* (2013.01); *H01L 2224/05647* (2013.01); *H01L 2224/10135* (2013.01); *H01L 2224/119* (2013.01); *H01L 2224/1147* (2013.01); *H01L 2224/11462* (2013.01); *H01L 2224/131* (2013.01); *H01L 2224/13025* (2013.01); *H01L 2224/13082* (2013.01); *H01L 2224/13083* (2013.01); *H01L 2224/13144* (2013.01); *H01L 2224/13155* (2013.01); *H01L 2224/14181* (2013.01); *H01L 2224/16058* (2013.01); *H01L 2224/16146* (2013.01); *H01L 2224/81139* (2013.01); *H01L 2224/81193* (2013.01); *H01L 2224/81815* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); *H01L 2225/06593* (2013.01); *H01L 2924/01013* (2013.01); *H01L 2924/01022* (2013.01); *H01L 2924/01028* (2013.01); *H01L 2924/01029* (2013.01); *H01L 2924/0132* (2013.01)

(56) References Cited

U.S. PATENT DOCUMENTS

2014/0327150 A1  11/2014  Jung et al.
2015/0054172 A1  2/2015  Shirono et al.

FOREIGN PATENT DOCUMENTS

JP  2013-187259 A  9/2013
TW  201508889 A  3/2015

* cited by examiner

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from Japanese Patent Application No. 2015-110601, filed May 29, 2015, the entire contents of which are incorporated herein by reference.

FIELD

Embodiments described herein relate generally to a semiconductor device and a manufacturing method of a semiconductor device.

BACKGROUND

In the related art, there is a semiconductor device in which a mounting area of the device is reduced by stacking and connecting substrates having semiconductor elements and integrated circuits provided thereon and/or therein. Although such a stacked semiconductor device reduces the required planar mounting area in a length direction and a width direction, in comparison with the case in which substrates are mounted side by side in one plane, reduction in a size in a stacked semiconductor device in the thickness direction is also required.

DETAILED DESCRIPTION

Provided are a semiconductor device and a manufacturing method of a semiconductor device, wherein the size in a thickness direction is reduced.

In general, according to one embodiment, a semiconductor device includes a first substrate, an aluminum pad, a first nickel electrode, a second substrate, a second nickel electrode, and a connection layer. The first substrate includes a wiring therein. The aluminum pad is provided adjacent to a surface layer of the first substrate and is connected to the wiring. In the first nickel electrode, a portion thereof extends inwardly of the first substrate and is connected to the aluminum pad. A top surface of the first nickel electrode projects from a surface of the first substrate. A portion of the second nickel electrode extends inwardly of the second substrate. A top surface of the second nickel electrode projects from a surface of the second substrate on a first substrate side (side facing the first substrate). The connection layer is formed of an alloy including tin and electrically connects the first nickel electrode and the second nickel electrode.

Figure 1:
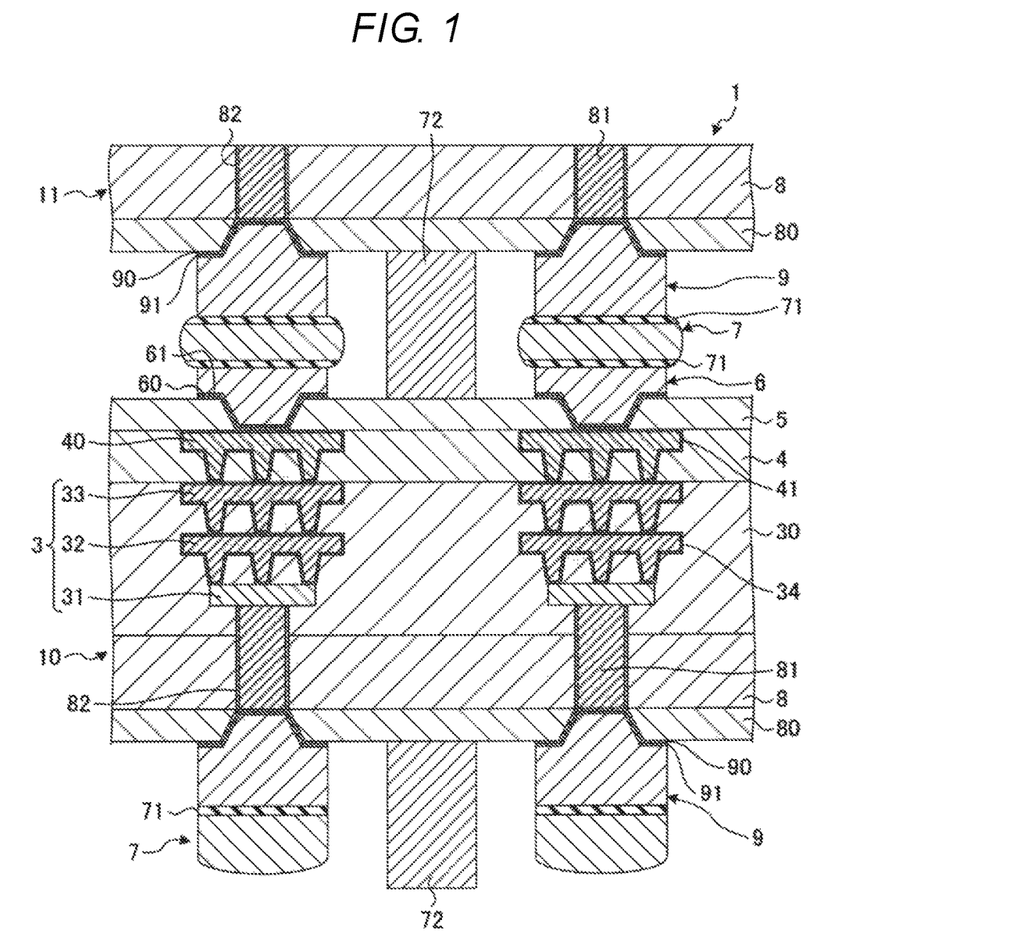
FIG. 1 is an explanatory diagram illustrating a schematic cross section of a semiconductor device according to an embodiment.

Hereinafter, a semiconductor device and a manufacturing method of a semiconductor device according to an embodiment will be described in detail with reference to the accompanying drawings. In addition, the embodiment does not limit the present invention. FIG. 1 is an explanatory diagram illustrating a schematic cross section of a semiconductor device 1 according to an embodiment.

As illustrated in FIG. 1, the semiconductor device 1 according to the embodiment has a structure allowing a reduction in a mounting area, by stacking and connecting a first substrate 10 including a semiconductor element and an integrated circuit, to a second substrate 11.

In previous devices, in a general semiconductor device which is manufactured by stacking substrates, for example, pillar shaped electrodes formed of copper (hereinafter, described as a "pillar electrode") are provided on the facing surface sides of the respective substrates, and the pillar electrodes facing each other are connected using solder.

However, when directly connecting the copper pillar electrodes using solder, solder diffuses into the material of the pillar electrode, and thus connection characteristics are degraded. Thus, a barrier layer to prevent the diffusion of solder into the pillar electrode material is provided between the pillar electrode and solder.

However, since one pillar electrode, one barrier layer, a solder layer, another barrier layer, and another pillar electrode are sequentially stacked between substrates in such a configuration, the distance between stacked substrates is increased and the final thickness of the semiconductor device is increased. Here, since the semiconductor device 1 has a pillar electrode formed of nickel (Ni) which itself limits of diffusion of the solder material thereinto instead of the copper pillar electrode, reduction (compactness) in the thickness direction is possible by elimination of the barrier layer.

Specifically, the first substrate 10 of the semiconductor device 1 includes a semiconductor layer 8, a protective film 80 provided on the lower surface of the semiconductor layer 8, and a first insulating layer 30, a second insulating layer 4, and a passivation film 5 sequentially stacked on the semiconductor layer 8.

The protective film 80 is formed of, for example, silicon nitride (SiN). The semiconductor layer 8 is formed of, for example, silicon (Si), and a through electrode 81 that penetrates the front and back surfaces of the semiconductor layer 8 is provided therethrough. The through electrode 81 is formed of, for example, copper (Cu) or nickel (Ni).

Further, a barrier metal film 82 preventing the diffusion of metal (for example, Cu) from the through electrode 81 to the semiconductor layer 8 is provided at the interface between the through electrode 81 and the semiconductor layer 8, that is, here it lines the opening through which the through electrode 81 extends. The barrier metal film 82 is formed of, for example, titanium (Ti). In addition, although not shown here, a semiconductor element, an integrated circuit, and the like are provided in and on the semiconductor layer 8. Further, although not shown here, an insulating film formed of, for example, silicon oxide ($SiO_2$) is formed between the protective film 80 and the semiconductor layer 8, and between the barrier metal film 82 and the semiconductor layer 8.

The first insulating layer 30 is made of, for example, $SiO_2$, and a multilayer wiring 3 is provided therein. The multilayer wiring 3 includes a first wiring 31 connected to the upper surface of the through electrode 81, a second wiring 32 connected to the upper surface of the first wiring 31, and a third wiring 33 connected to the upper surface of the second wiring 32.

The first wiring 31 is formed of, for example, tungsten (W). The second wiring 32 and the third wiring 33 are formed of, for example, Cu. The second wiring 32 and the third wiring 33 are covered with the barrier metal film 34. The barrier metal film 34 is formed of, for example, titanium (Ti).

The second insulating layer 4 is formed of, for example, $SiO_2$, and an aluminum pad 40 is connected to the upper surface of the third wiring 33. The aluminum pad 40 is covered with the barrier metal film 41. The barrier metal film 41 is formed of, for example, Ti. The passivation film 5 is formed of, for example, SiN or polyimide.

A pillar-shaped first Ni electrode 6 formed of nickel (Ni) of which a portion is embedded in the passivation film 5 and connected to the aluminum pad 40. A top surface of the electrode 6 projects from a surface of the passivation film 5 on the upper surface of the first substrate 10.

A barrier metal film 60 is provided at the interface between the first Ni electrode 6 and the passivation film 5. The barrier metal film 60 is formed of, for example, Ti. Further, the first Ni electrode 6 includes a Cu diffusion region 61 containing Cu, in a site in contact with the barrier metal film 60. The Cu diffusion region 61 is formed where Cu is diffused into the first Ni electrode 6, and here Cu is used as a seed layer in the process of forming the first Ni electrode 6.

Further, a pillar-shaped second Ni electrode 9 formed of nickel (Ni) is provided on the lower surface side of the first substrate 10. Specifically, the second Ni electrode 9 has a shape in which a portion thereof is embedded in the protective film 80 and a top surface which projects from a surface (here, a lower surface) of the protective film 80.

The barrier metal film 90 is provided in the interface between the second Ni electrode 9 and the protective film 80. The barrier metal film 90 is formed of, for example, Ti. Further, the second Ni electrode 9 has a Cu diffusion region 91 containing Cu in a site in contact with the barrier metal film 90. The Cu diffusion region 91 is formed by Cu being diffused into the second Ni electrode 9, and here Cu is also used as a seed layer in the process of forming the second Ni electrode 9.

Further, a connection layer 7 formed of an alloy containing tin (Sn) is provided on the top surface (here, the lower surface) of the second Ni electrode 9. The connection layer 7 is formed of, for example, a tin based solder. Further, in the connection layer 7, the portion in contact with the second Ni electrode 9 includes an Au diffusion region 71 containing gold (Au).

The Au diffusion region 71 is formed by Au (gold) from an Au film 104 (see FIG. 4C), which will be described later, formed on the top surface of the second Ni electrode 9 after diffusing into the connection layer 7 during the manufacturing process of the device. When the first substrate 10 is located on another substrate, such as a lead frame or a mounting substrate (not shown), the connection layer 7 is connected to the connection terminal on the other substrate surface. Further, the supporting portion 72 is provided between the adjacent second Ni electrodes 9. The supporting portion 72 is formed of, for example, a photosensitive adhesive resin.

Meanwhile, the configuration of the connection portion of the upper surface side and the back surface side in the second substrate 11 is the same as that of first substrate 10. Here, the configuration of the semiconductor element and the integrated circuit formed in and/or on the second substrate 11 may be the same as or different from that of the first substrate 10. Therefore, FIG. 1 selectively illustrates portions on the lower side from the semiconductor layer 8 of the second substrate 11.

In the semiconductor device 1, the second substrate 11 is stacked on the first substrate 10. Thus, the semiconductor device 1 has a structure in which the connection layer 7 of the second substrate 11 is stacked immediately above the first Ni electrode 6 of the first substrate 10, the second Ni electrode 9 of the second substrate 11 is stacked immediately above the connection layer 7, and the second substrate 11 is stacked on the second Ni electrode 9 of the second substrate 11.

Further, in the semiconductor device 1, one end surface (here, the upper surface) of the supporting portion 72 of the second substrate 11 abuts on the lower surface of the protective film 80 of the second substrate 11, and the other end surface (here, the lower surface) abuts on the upper surface of the passivation film 5 of the first substrate 10.

As described above, the semiconductor device 1 includes a first substrate 10 having a multilayer wiring 3 provided therein, an aluminum pad 40 provided in a surface layer of the first substrate 10 having the multilayer wiring 3 provided therein and connected to the multilayer wiring 3, and a first Ni electrode 6 of which a portion is embedded in the first substrate 10 and connected to the aluminum pad 40. The top surface of the first Ni electrode 6 projects from a surface of the first substrate 10.

The semiconductor device 1 includes a second substrate 11 stacked on the first substrate 10, a second Ni electrode 9 of which a portion is embedded in the second substrate 11 and a top surface of which projects from a surface on the first substrate 10 side of the second substrate 11, and a solder connection layer 7 that connects the first Ni electrode 6 and the second Ni electrode 9.

In this manner, in the semiconductor device 1, the first substrate 10 and the second substrate 11 are connected by a stacked body of three components: the first Ni electrode 6, the solder connection layer 7, and the second Ni electrode 9. This enables a reduction in the size of the semiconductor device 1 in the thickness direction, in comparison with a prior semiconductor device in which stacked substrates including Cu pillar electrodes are connected by a stack body of five components: a pillar electrode, a barrier layer, a solder layer, a barrier layer, and a pillar electrode.

The first Ni electrode 6 of the semiconductor device 1 includes a Cu diffusion region 61 containing Cu in a portion thereof in contact with the barrier metal film 60. The first Ni electrode 6 may be formed using the Cu diffusion region 61 as a seed layer. Therefore, according to the embodiment, without significantly changing the existing prior manufacturing process, it is possible to manufacture the semiconductor device 1 having a reduced size in the thickness direction.

Further, in the connection layer 7 of the semiconductor device 1, the portion in contact with the first Ni electrode 6 and the portion in contact with the second Ni electrode 9 include Au diffusion regions 71 containing Au. Thus, in the semiconductor device 1, it is possible to reduce the connection resistance between the connection layer 7, the first Ni electrode 6 and the second Ni electrode 9.

Further, the semiconductor device 1 includes a supporting portion 72 which is made of resin, and of which one end surface abuts on a surface on the first substrate 10, and the other end surface abuts on a surface on the first substrate 10 side of the second substrate 11. When the second substrate 11 is stacked on the first substrate 10, the supporting portion 72 establishes the distance therebetween prevents the distance between the first substrate 10 and the second substrate 11 from being excessively reduced.

Therefore, according to the semiconductor device 1, when the second substrate 11 is stacked on the first substrate 10, it is possible to prevent the solder of the connection layer 7 from being excessively crushed and the resulting bowing outwardly sag, or from extending to the passivation film 5 of the first substrate 10 and thereby cause current leakage.

In addition, when the height of the top surface of the first Ni electrode 6 from the surface of the passivation film 5 is between 1 µm and 10 µm, and the height (thickness) of the supporting portion 72 is between 17 µm and 25 µm, when the area of the surface of the first substrate 10 occupied by the supporting portion 72 is between 10% and 50% of the area of the surface of the first substrate 10, the supporting portion 72 may prevent the solder from bowing or sagging.

Next, with reference to FIG. 2A to FIG. 7, the manufacturing method of the semiconductor device 1 according to the embodiment will be described. FIG. 2A to FIG. 7 are explanatory diagrams illustrating the manufacturing processes of the semiconductor device 1 according to the embodiment. Hereinafter, among components in FIG. 2A to FIG. 7, the same components as the components in FIG. 1 are denoted by the same reference numerals as the reference numerals in FIG. 1, and thus a repetitive description thereof will be omitted.

The manufacturing processes of the first substrate 10 and the second substrate 11 are identical, except that the forming processes of a semiconductor element and an integrated circuit to be formed on the semiconductor layer 8 may be different. For this reason, here, the manufacturing process of the first substrate 10 will be described, and a description about the manufacturing process of the second substrate 11 will be omitted.

Further, in the manufacturing process of the first substrate 10, a process of forming the first insulating layer 30 and the multilayer wiring 3 on the semiconductor layer 8 is the same as the manufacturing process of a general semiconductor device, such that the description thereof will be omitted here.

Figure 2A:
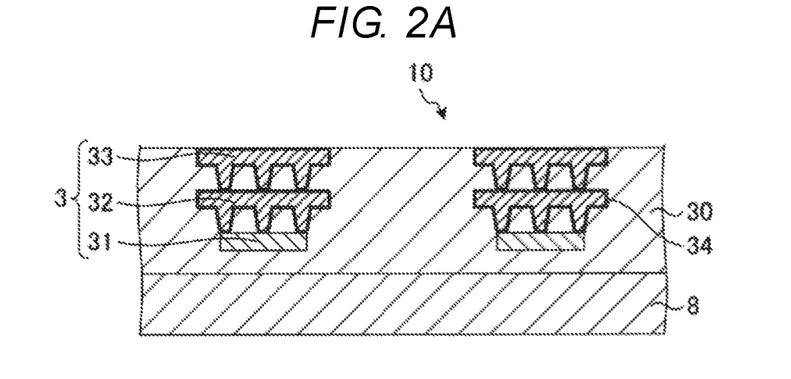
FIGS. 2A to 2C, FIGS. 3A to 3C, FIGS. 4A to 4C, FIG. 5, FIGS. 6A and 6B, and FIG. 7 are explanatory diagrams illustrating a manufacturing process of the semiconductor device according to the embodiment.
Figure 2B:
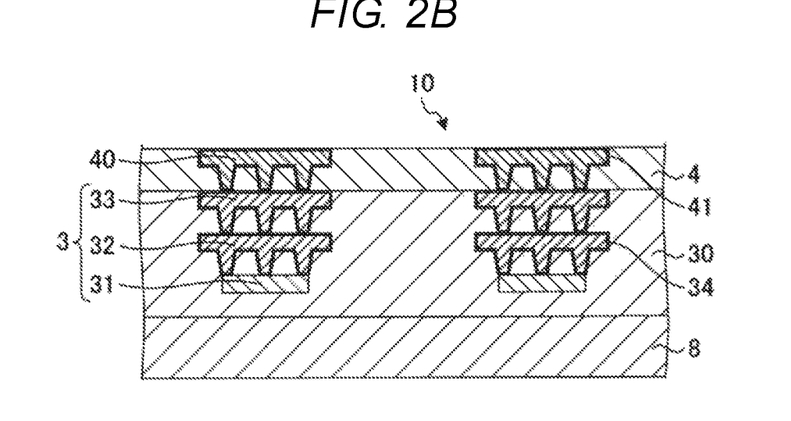

When the semiconductor device 1 is manufactured, as illustrated in FIG. 2A, a first substrate 10 is prepared in which a first insulating layer 30 and a multilayer wiring 3 are formed on the semiconductor layer 8. Thereafter, as illustrated in FIG. 2B, a second insulating layer 4 is formed by forming $SiO_2$ on the first insulating layer 30, for example, by depositing a $SiO_2$ layer on the first insulating layer 30 using chemical vapor deposition (CVD).

Then, a barrier metal film 41 is formed by selectively removing $SiO_2$ at a region for forming the aluminum pad 40 from the second insulating layer 4, for example, by reactive ion etching (RIE), and covering the surface of the second insulating layer 4 with Ti.

Thereafter, after aluminum (Al) is formed on the second insulating layer 4, for example, by sputtering, aluminum is patterned by RIE. Thus, as illustrated in FIG. 2B, the aluminum pad 40 is formed on the second insulating layer 4.

Figure 2C:
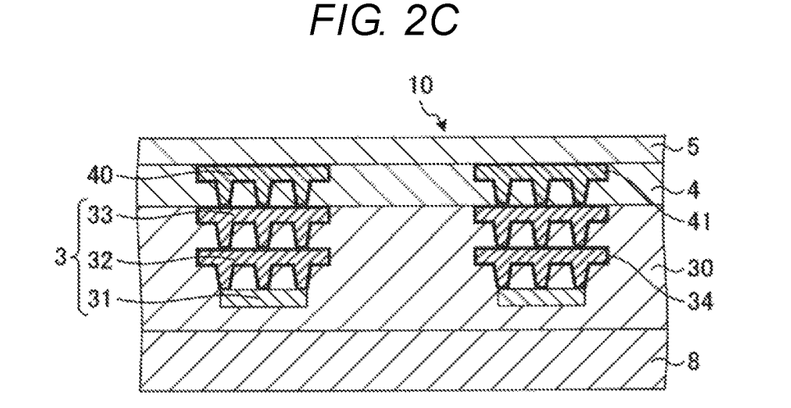

Subsequently, as illustrated in FIG. 2C, a passivation film 5 is formed by stacking SiN or polyimide on the second insulating layer 4 having the aluminum pad 40 formed therein. In addition, the passivation film 5 may include $SiO_2$ between the aluminum pad 40 and the passivation film 5.

Figure 3A:
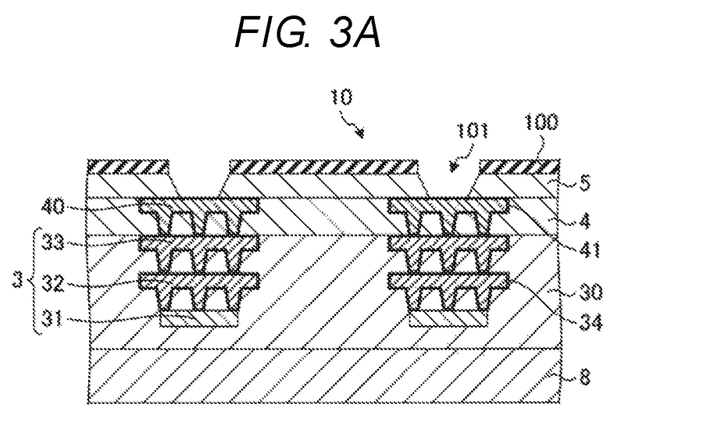

Then, as illustrated in FIG. 3A, a resist 100 is applied on the passivation film 5, and the resist 100 at a region for forming the first Ni electrode 6 (see FIG. 1) is selectively removed using photolithography techniques.

An opening 101 extending from a surface of the passivation film 5 to a surface of the aluminum pad 40 covered with the barrier metal film 41 is formed, at a region for forming the first Ni electrode 6 in the passivation film 5, by performing etching with the remaining patterned resist 100 used as a mask.

Figure 3B:
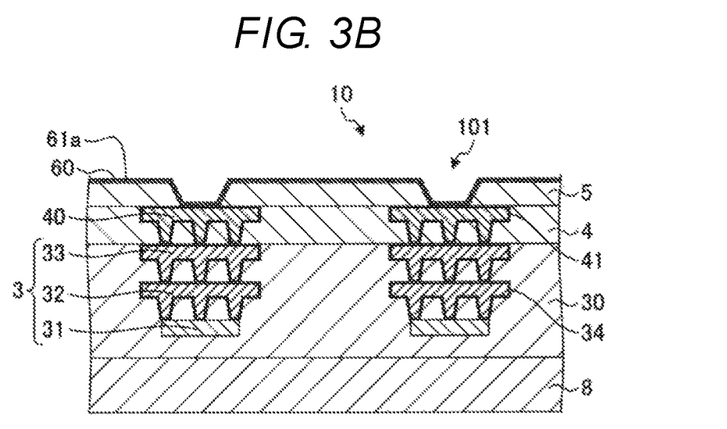

Subsequently, as illustrated in FIG. 3B, after removing the resist 100, a barrier metal film 60 is formed by covering the upper surface of the passivation film 5, and the inner peripheral surface and bottom surface of the opening 101, with Ti. Further, a seed layer film 61a is formed by covering the surface of the barrier metal film 60 with Cu.

Figure 3C:
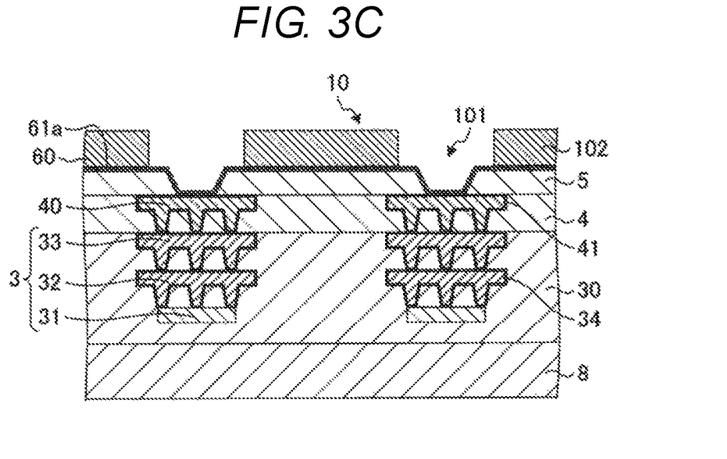

Subsequently, as illustrated in FIG. 3C, a resist 102 is formed over the Cu seed layer film 61a and patterned with openings, such that openings 101 over the seed layer film 61a are created by selectively removing the resist 102 on the region for forming the first Ni electrode 6 (see FIG. 1) after applying a resist 102 to the surface of the seed layer film 61a.

Figure 4A:
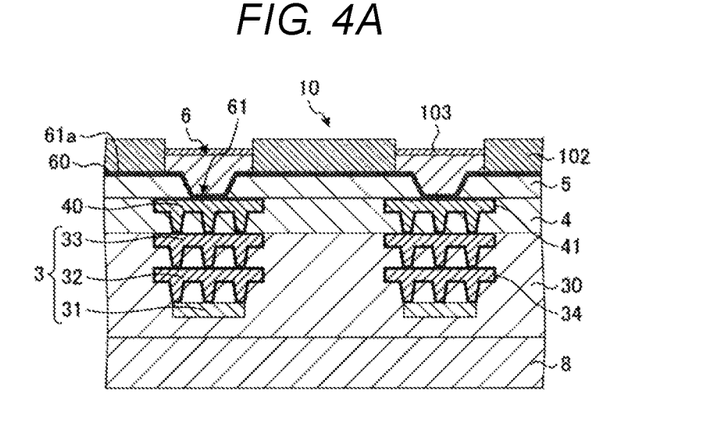

Thereafter, as illustrated in FIG. 4A, the first Ni electrode 6 is formed by stacking Ni on the seed layer film 61a at the region in which the resist 102 is removed and the underlying seed layer film 61a is exposed. Ni is formed on the exposed seed layer film 61a by electrolytic plating using the seed layer film 61a as an electrode film. In addition, Ni is diffused from the first Ni electrode 6 into the seed layer film 61a at a region in which the first Ni electrode 6 is in contact with the seed layer film 61a, and Cu is diffused from the seed layer film 61a into the first Ni electrode 6.

Thus, the seed layer film 61a in contact with the first Ni electrode 6 becomes an alloy of Cu and Ni, becomes a portion of the first Ni electrode 6, and a Cu diffusion region 61 is formed at the region in contact with the barrier metal film 60 of first Ni electrode 6.

As a result, a region of pure Cu is no longer present between the barrier metal film 60 and the first Ni electrode 6. Thus, a first Ni electrode 6 of which a portion is embedded in the opening 101 having the barrier metal film 60 provided therein and is connected to the aluminum pad 40 and a top surface projects from the surface of the passivation film 5 is formed.

Figure 4B:
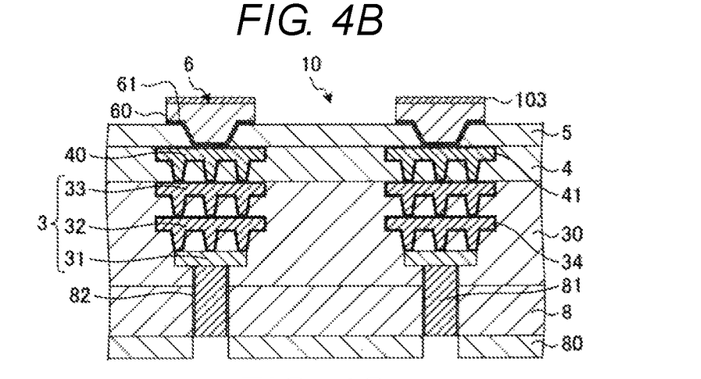

Then, after an Au film 103 is formed on the upper surface of the first Ni electrode 6, as illustrated in FIG. 4B, the resist 102 is removed. The seed layer film 61a and the barrier metal film 60 are removed from the upper surface of the passivation film 5 by performing RIE using the first Ni electrode 6 (including the Au film 103 formed on the upper surface thereof) as a mask.

Subsequently, the through electrode 81 is formed in the semiconductor layer 8. Here, for example, the through electrode 81 is formed by forming the protective film 80 on the lower surface of the semiconductor layer 8, forming a through silicon via (TSV) extending from the lower surface of the semiconductor layer 8 to the lower surface of the first wiring 31, covering the inner peripheral surface of the TSV with the barrier metal film 82, and embedding Cu in the TSV.

Figure 4C:
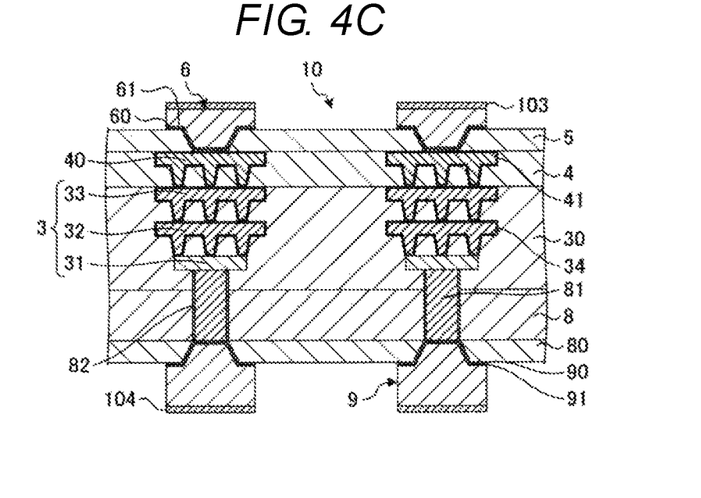

Thereafter, as illustrated in FIG. 4C, the same process as the process described with reference to FIG. 3A to FIG. 4C is performed on the protective film 80, and the formation of the barrier metal film 90 and the formation of the second Ni electrode 9 including the Cu diffusion region 91 at a region in contact with the barrier metal film 90 are performed.

Thus, a pillar-shaped second Ni electrode 9 is formed of which a portion is embedded in the protective film 80 and a top surface projects from a surface (here, the lower surface) of the protective film 80. The Au film 104 is formed on the top surface (here, the lower surface) of the second Ni electrode 9.

Figure 5:
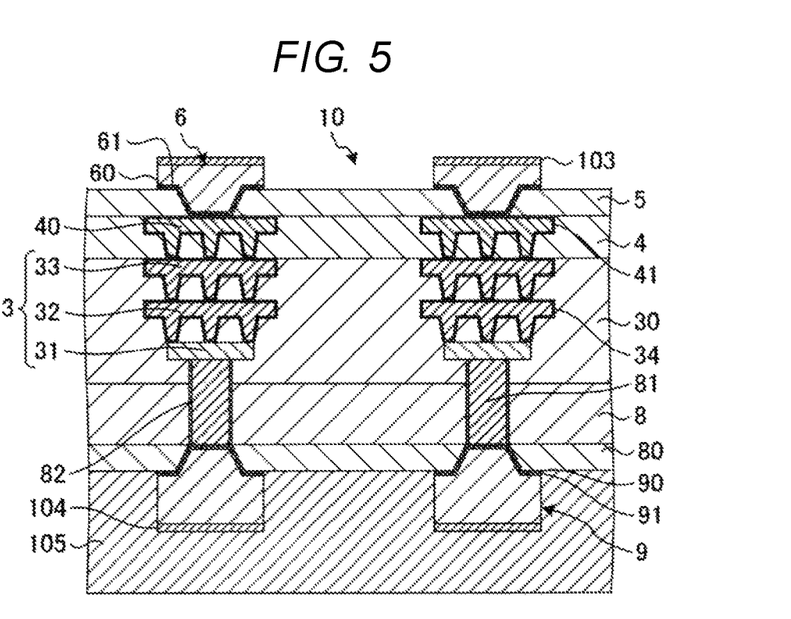
Figure 6A:
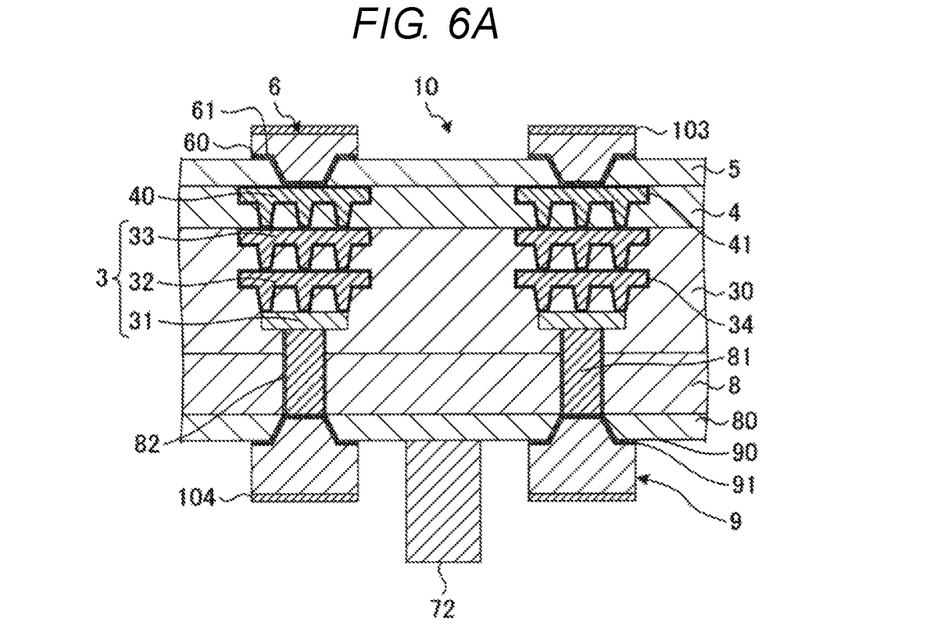
Figure 6B:
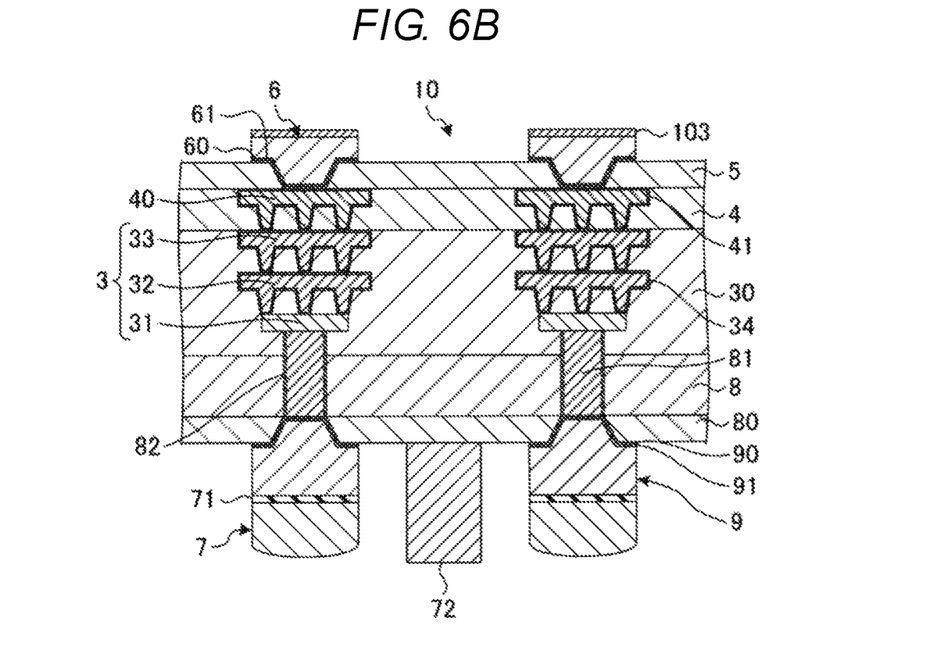

Subsequently, as illustrated in FIG. 5, the photosensitive adhesive resin 105 is applied to the lower surface (under-side) of the first substrate 10. Then, exposure is performed through a patterned mask using a stepper or aligner. The exposed portion of the photosensitive adhesive resin 105 is developed. That is, the adhesive resin 105 at the portion irradiated with light through the openings in the patterned mask is removed. Thus, a supporting portion 72 illustrated in FIG. 6A is formed. Then, the connection layer 7 is formed by forming a solder layer on the lower surface of the Au film 104, as illustrated in FIG. 6B.

In addition, in a portion in which the connection layer 7 is in contact with the Au film 104, the solder material is diffused from the connection layer 7 into the Au film 104, and Au is diffused from the Au film 104 into the connection layer material 7. Thus, the Au film 104 at a portion in contact with the connection layer 7 becomes an alloy of Au and the material of the solder to become a portion of the connection layer 7, the Au diffusion region 71 is formed in a portion of the connection layer 7 in contact with the second Ni electrode 9, and thus the first substrate 10 is completed.

Figure 7:
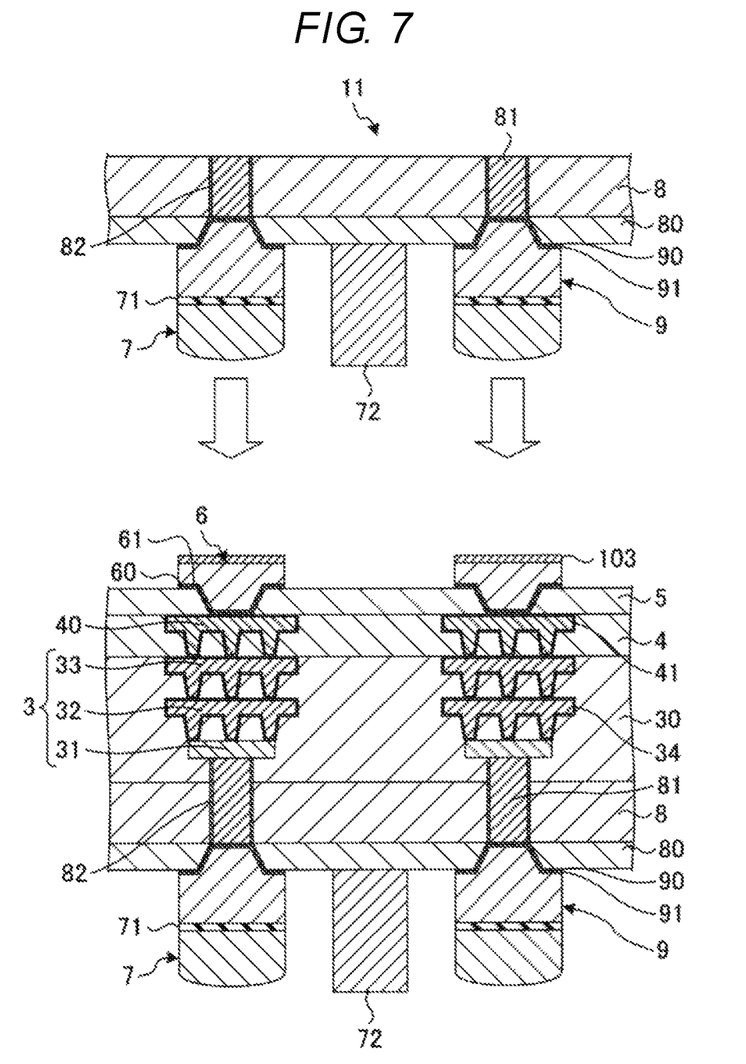

Last, as illustrated in FIG. 7, the completed second substrate 11 is placed on the completed first substrate 10, the alignment of the first Ni electrode 6 of the first substrate 10 and the connection layer 7 of the corresponding second substrate 11 is performed, the second substrate 11 is stacked on the first substrate 10 and heat is applied to reflow the solder of the connection layers 7, and as a result, the semiconductor device 1 illustrated in FIG. 1 is completed.

As described later, in the semiconductor device according to an embodiment, the first substrate and the second substrate are connected by a stack of three: the first Ni electrode on the first substrate side, the solder connection layer, and the second Ni electrode on the second substrate side.

This reduces the size of the semiconductor device in the thickness direction, in comparison with a general semiconductor device in which stacked substrates are connected five components: a pillar electrode, a barrier layer, a solder layer, a barrier layer, and a pillar electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A semiconductor device, comprising:
   a first substrate including a surface layer and a wiring therein;
   an aluminum pad adjacent to the surface layer and connected to the wiring;
   a first nickel electrode wherein a portion thereof extends inwardly of the first substrate and is connected to the aluminum pad, and wherein a top surface of the first nickel electrode projects from a first surface of the first substrate;
   a second substrate on the first substrate and having a first substrate side;
   a second nickel electrode wherein a portion thereof extends inwardly of the second substrate, and wherein a top surface of the second nickel electrode projects from a second surface of the second substrate on the first substrate side;
   a connection layer comprising an alloy including tin, the connection layer electrically connecting the first nickel electrode and the second nickel electrode; and
   a barrier metal film comprising titanium, the barrier metal film located at an interface between the first nickel electrode and the first substrate, and an interface between the first nickel electrode and the aluminum pad,
   wherein the first nickel electrode includes copper.

2. The device according to claim 1, wherein at least a portion of the connection layer in contact with the first nickel electrode comprises gold and at least a portion of the connection layer in contact with the second nickel electrode comprises gold.

3. The device according to claim 1, further comprising:
   a supporting portion extending between the first and second substrate, and having a first end surface which abuts on the first surface and a second end surface which abuts on the second surface.

4. The device according to claim 3, wherein the supporting portion comprises a photocured resin.

5. The device according to claim 1, wherein the connection layer comprises a tin-gold alloy portion adjacent to at least one of a contact location of the connection layer with the first nickel electrode and a contact location of the connection layer with the second nickel electrode.

6. A semiconductor device, comprising:
   a first substrate including a surface layer and a wiring therein;
   an aluminum pad adjacent to the surface layer and connected to the wiring;
   a first nickel electrode wherein a portion thereof extends inwardly of the first substrate and is connected to the aluminum pad, and wherein a top surface of the first nickel electrode projects from a first surface of the first substrate;
   a second substrate on the first substrate and having a first substrate side;
   a second nickel electrode wherein a portion thereof extends inwardly of the second substrate, and wherein a top surface of the second nickel electrode projects from a second surface of the second substrate on the first substrate side; and
   a connection layer comprising an alloy including tin, the connection layer electrically connecting the first nickel electrode and the second nickel electrode,
   wherein at least a portion of the connection layer in contact with the first nickel electrode comprises gold and at least a portion of the connection layer in contact with the second nickel electrode comprises gold.

7. The device according to claim 6, further comprising:
   a supporting portion extending between the first and second substrate, and having a first end surface which abuts on the first surface and a second end surface which abuts on the second surface.

8. The device according to claim 7, wherein the supporting portion comprises a photocured resin.

9. The device according to claim 6, wherein the connection layer comprises a tin-gold alloy portion adjacent to at least one of a contact location of the connection layer with the first nickel electrode and a contact location of the connection layer with the second nickel electrode.

10. A semiconductor device, comprising:
    a first substrate including a surface layer and a wiring therein;
    an aluminum pad adjacent to the surface layer and connected to the wiring;

a first nickel electrode wherein a portion thereof extends inwardly of the first substrate and is connected to the aluminum pad, and wherein a top surface of the first nickel electrode projects from a first surface of the first substrate;

a second substrate on the first substrate and having a first substrate side;

a second nickel electrode wherein a portion thereof extends inwardly of the second substrate, and wherein a top surface of the second nickel electrode projects from a second surface of the second substrate on the first substrate side; and a connection layer comprising an alloy including tin, the connection layer electrically connecting the first nickel electrode and the second nickel electrode, wherein the connection layer comprises a tin-gold alloy portion adjacent to at least one of a contact location of the connection layer with the first nickel electrode and a contact location of the connection layer with the second nickel electrode.

11. The device according to claim 10, further comprising:
a supporting portion extending between the first and second substrate, and having a first end surface which abuts on the first surface and a second end surface which abuts on the second surface.

12. The device according to claim 11, wherein the supporting portion comprises a photocured resin.

13. A semiconductor device, comprising:
a first substrate including a surface layer and a wiring therein and a first through electrode;
an aluminum pad adjacent to the surface layer and connected to the wiring;
a first nickel electrode wherein a portion thereof extends inwardly of the first substrate and is connected to the aluminum pad, and wherein a top surface of the first nickel electrode projects from a first surface of the first substrate;
a second substrate on the first substrate and having a first substrate side, the second substrate having a second through electrode;
a second nickel electrode wherein a portion thereof extends inwardly of the second substrate, and wherein a top surface of the second nickel electrode projects from a second surface of the second substrate on the first substrate side; and
a connection layer comprising an alloy including tin, the connection layer electrically connecting the first nickel electrode and the second nickel electrode.

14. The device according to claim 13, further comprising:
a barrier metal film comprising titanium, the barrier metal film located at an interface between the first nickel electrode and the first substrate, and an interface between the first nickel electrode and the aluminum pad, wherein the first nickel electrode includes copper.

15. The device according to claim 13, wherein at least a portion of the connection layer in contact with the first nickel electrode comprises gold and at least a portion of the connection layer in contact with the second nickel electrode comprises gold.

16. The device according to claim 13, further comprising:
a supporting portion extending between the first and second substrate, and having first end surface which abuts on the first surface and a second end surface which abuts on the second surface.

17. The device according to claim 16, wherein the supporting portion comprises a photocured resin.

18. The device according to claim 13, wherein the connection layer comprises a tin-gold alloy portion adjacent to at least one of a contact location of the connection layer with the first nickel electrode and a contact location of the connection layer with the second nickel electrode.

* * * * *